(12) United States Patent
Yoon et al.

(10) Patent No.: US 11,257,894 B2
(45) Date of Patent: Feb. 22, 2022

(54) DISPLAY DEVICE

(71) Applicant: SAMSUNG DISPLAY CO., LTD., Yongin-si (KR)

(72) Inventors: Juwon Yoon, Yongin-si (KR); Taehoon Yang, Yongin-si (KR); Donghwan Kim, Yongin-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 163 days.

(21) Appl. No.: 16/808,490

(22) Filed: Mar. 4, 2020

(65) Prior Publication Data
US 2021/0013286 A1 Jan. 14, 2021

(30) Foreign Application Priority Data
Jul. 8, 2019 (KR) .................. 10-2019-0082226

(51) Int. Cl.
*H01L 27/32* (2006.01)
*H01L 27/12* (2006.01)

(52) U.S. Cl.
CPC ...... *H01L 27/3276* (2013.01); *H01L 27/3248* (2013.01); *H01L 27/3258* (2013.01); *H01L 27/124* (2013.01); *H01L 27/1248* (2013.01)

(58) Field of Classification Search
CPC ............. H01L 27/3276; H01L 27/3248; H01L 27/3258; H01L 27/1248; H01L 27/124
See application file for complete search history.

(56) References Cited

U.S. PATENT DOCUMENTS

| 6,534,788 B1 | 3/2003 | Yeo et al. |
| 9,910,523 B2 | 3/2018 | Kim et al. |
| 2017/0017328 A1 | 1/2017 | Tsai et al. |

FOREIGN PATENT DOCUMENTS

| KR | 1020160053383 A | 5/2016 |
| KR | 1020170073482 A | 6/2017 |

*Primary Examiner* — Anthony Ho
(74) *Attorney, Agent, or Firm* — Cantor Colburn LLP

(57) ABSTRACT

A display device includes: a substrate; a plurality of light-emitting diodes above the substrate; a plurality of pixel circuits above the substrate and electrically connected to the plurality of light-emitting diodes; a scan line extending in a first direction above the substrate, where the scan line delivers a scan signal to the plurality of pixel circuits; and a scan driver between the substrate and the plurality of pixel circuits and providing the scan signal to the scan line. A distance between the scan driver and the substrate is less than a distance between the plurality of pixel circuits and the substrate.

20 Claims, 6 Drawing Sheets

DISPLAY DEVICE

This application claims priority to Korean Patent Application No. 10-2019-0082226, filed on Jul. 8, 2019, and all the benefits accruing therefrom under 35 U.S.C. § 119, the content of which in its entirety is herein incorporated by reference.

BACKGROUND

1. Field

One or more embodiments relate to a display device.

2. Description of Related Art

In accordance with the rapid development in display technology for visually expressing various kinds of electrical signal information, various flat panel display devices having desired characteristics such as a small thickness, a light weight, and low power consumption have been researched and developed. Among various display devices, organic light-emitting display devices may not include extra light sources, may be driven by low voltages, and may have a lightweight thin structure. In addition, the organic light-emitting display devices have attracted the attention as next-generation display devices by having desired characteristics in terms of wide viewing angle, high contrast, and high response speed. Recently, on the top surface of display devices, elements such as physical buttons are being removed and display areas for displaying images are being enlarged, and thus, research into reducing a peripheral area, which is an area that does not display images, is continually being performed.

SUMMARY

One or more embodiments include a display device in which a peripheral area is reduced.

According to an embodiment, a display device includes a substrate, a plurality of light-emitting diodes above the substrate, a plurality of pixel circuits above the substrate and electrically connected to the plurality of light-emitting diodes, a scan line extending in a first direction above the substrate, where the scan line delivers a scan signal to the plurality of pixel circuits, and a scan driver between the substrate and the plurality of pixel circuits and providing the scan signal to the scan line. In such an embodiment, a distance between the scan driver and the substrate is less than a distance between the plurality of pixel circuits and the substrate.

In an embodiment, the plurality of light-emitting diodes, the plurality of pixel circuits, and the scan drivers may be in a display area of the display device.

In an embodiment, the display device may further include an output line electrically connected to an output terminal of the scan driver and the scan line, and the output line may be in a same layer as the output terminal.

In an embodiment, the output line may extend in the first direction and cross the display area, and the output line and the scan line may be in contact with each other in a plurality of positions.

In an embodiment, the number of contact points between the output line and the scan line may be equal to the number of the plurality of pixel circuits connected to the scan line.

In an embodiment, the display device may further include a first planarization layer covering the scan driver and the output line, and a second planarization layer between the pixel circuits and the plurality of light-emitting diodes, wherein the pixel circuits and the scan line are on the first planarization layer, and the scan line may be in contact with the output line via a contact hole defined in the first planarization layer.

In an embodiment, the output line and the scan line may extend to a peripheral area at an outer circumstance of the display area, and a contact point between the output line and the scan line may be in the peripheral area.

In an embodiment, an opening surrounding in the display area may be defined in the second planarization layer, and a metal material may be in the opening.

In an embodiment, the contact point between the output line and the scan line may be in an area defined by the opening.

In an embodiment, inorganic layers may be respectively at an upper surface and a lower surface of the first planarization layer, and the inorganic layers may be in contact with each other at an outer periphery of the first planarization layer.

According to one or more embodiments, the display device includes a substrate including a display area and a peripheral area at an outer circumference of the display area, a scan driver on the substrate in the display area, where the scan driver generates a scan signal, an output line on the substrate in the display area and electrically connected to the scan driver, a first planarization layer covering the scan driver and the output line, a thin-film transistor on the first planarization layer in the display area, a scan line on the first planarization layer in the display area and connected to the output line to deliver the scan signal to the thin-film transistor, a second planarization layer covering the thin-film transistor and the scan line, and a light-emitting diode on the second planarization layer in the display area and electrically connected to the thin-film transistor.

In an embodiment, the scan line and the output line may be in contact with each other through a contact hole defined in the first planarization layer.

In an embodiment, a contact point between the output line and the scan line may be in the display area.

In an embodiment, the output line and the scan line may be in contact with each other at a plurality of positions.

In an embodiment, the output line and the scan line may extend to the peripheral area, and the contact point between the output line and the scan line may be in the peripheral area.

In an embodiment, an opening surrounding the display area may be defined in the second planarization layer, and the opening may be filled with a metal material.

In an embodiment, the contact point may be in an area defined by the opening.

In an embodiment, the light-emitting diode may include a pixel electrode electrically connected to the thin-film transistor, an opposite electrode above the pixel electrode, and an intermediate layer between the pixel electrode and the opposite electrode, a common voltage line, which applies an electrical signal to the opposite electrode, may be arranged in the peripheral area, the opposite electrode and the common voltage line may be connected to each other by a protective conductive layer, and the protective conductive layer may fill the opening.

In an embodiment, inorganic layers may be respectively at an upper surface and a lower surface of the first planarization layer, and the inorganic layers may be in contact with each other at an outer periphery of the first planarization layer.

In an embodiment, the output line may be integrally formed as a single unitary body with an output terminal of the scan driver, and the output terminal may be a drain electrode of a thin-film transistor of the scan driver.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
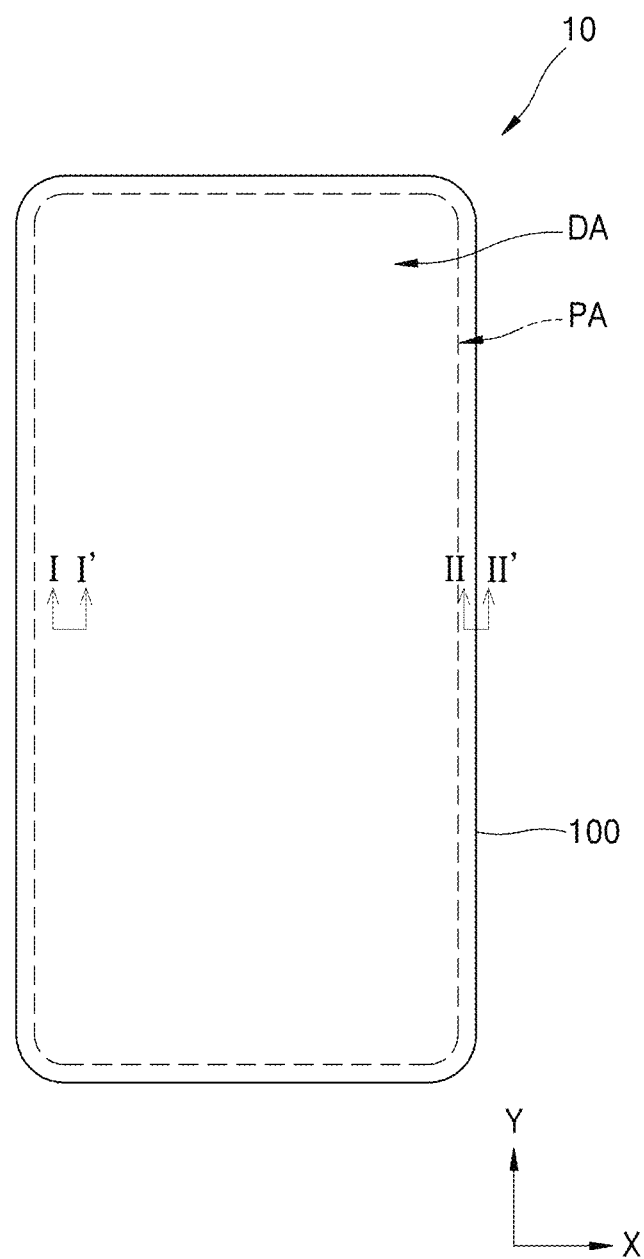
FIG. 1 is a schematic plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list elements and do not modify the individual elements of the list. For example, the expression "at least one of a, b or c" indicates only a, only b, only c, both a and b, both a and c, both b and c, all of a, b, and c, or variations thereof.

It will be understood that although terms such as "first," "second" may be used herein to describe various components, these components are not limited by these terms, and the terms are only used to distinguish one component from one another. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In embodiments, it will be understood that when a layer, an area, or a component is referred to as being "on" another layer, area, or component, the layer, area, or component may be directly on the other layer, area, or the component, or an intervening layer, region, or component may be therebetween.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Sizes of components in the drawings may be exaggerated or reduced for convenience of explanation. In other words, since sizes and thicknesses of components in the drawings are arbitrarily illustrated for convenience of explanation, the disclosure is not limited thereto.

When a certain embodiment may be differently implemented, a specific process order may be performed differently from the described order. For example, two consecutively described processes may be performed substantially at the same time or performed in an order opposite to the described order.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments will be described in detail with reference to the accompanying drawings. Throughout the descriptions, same numeral references will be given to same or corresponding components, and any repetitive detailed descriptions thereof may be omitted or simplified.

Figure 2:
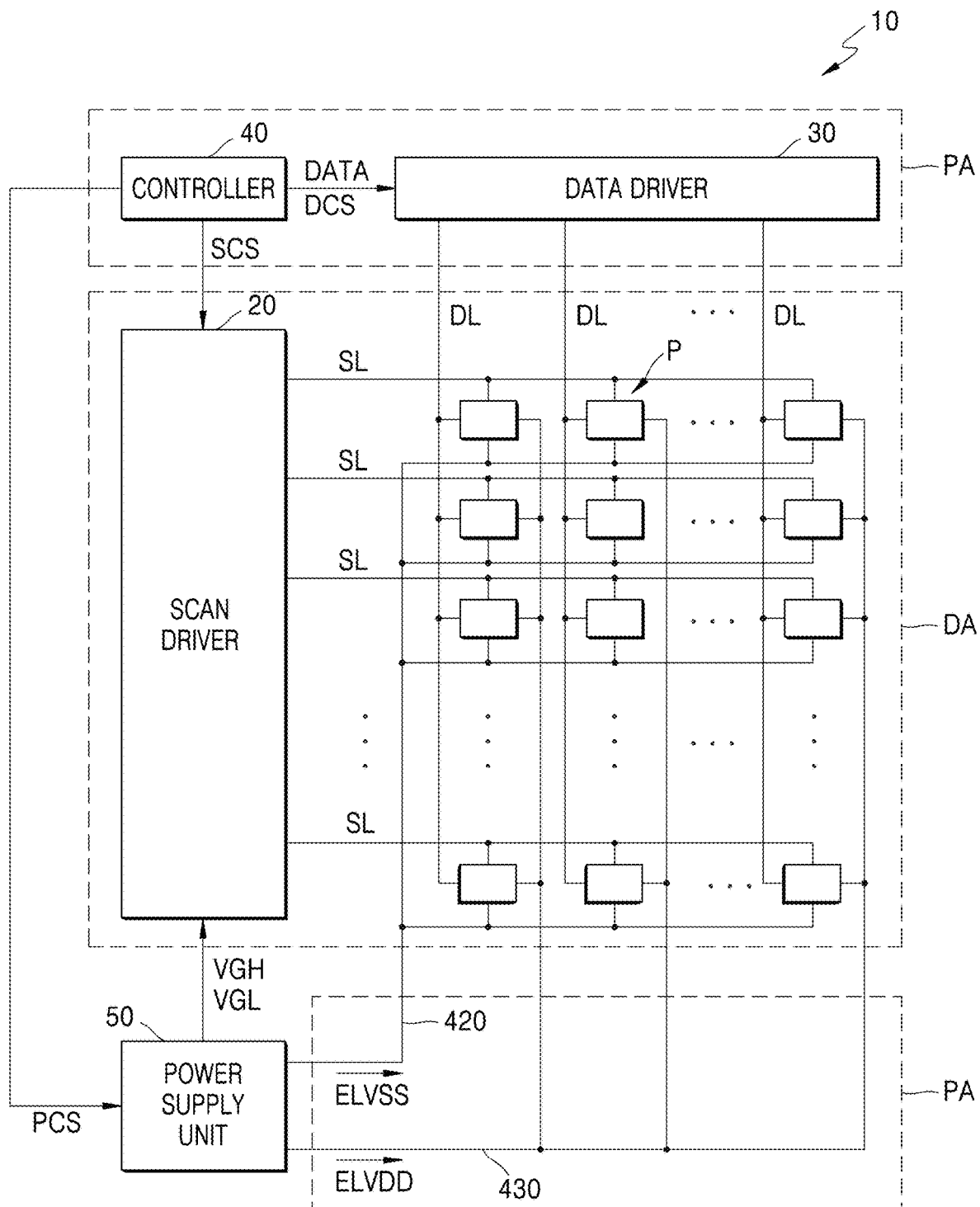
FIG. 2 is a schematic block diagram of a structure of the display device shown in FIG. 1.
Figure 3:
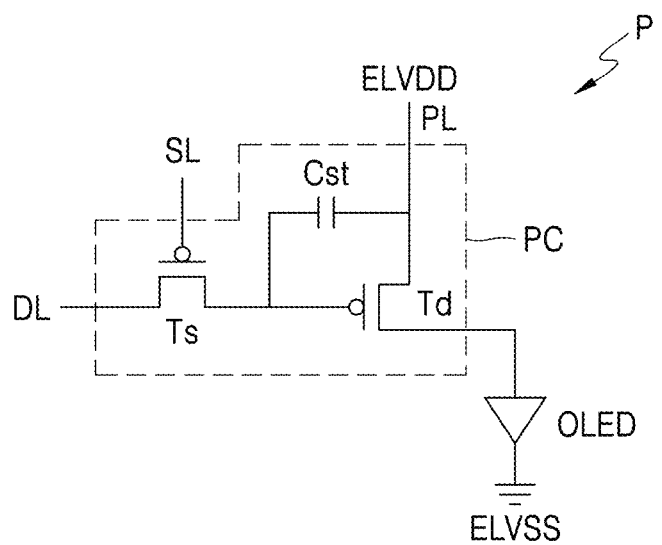
FIG. 3 is an equivalent circuit diagram of an embodiment of a sub-pixel of the display device shown in FIG. 1.
Figure 4:
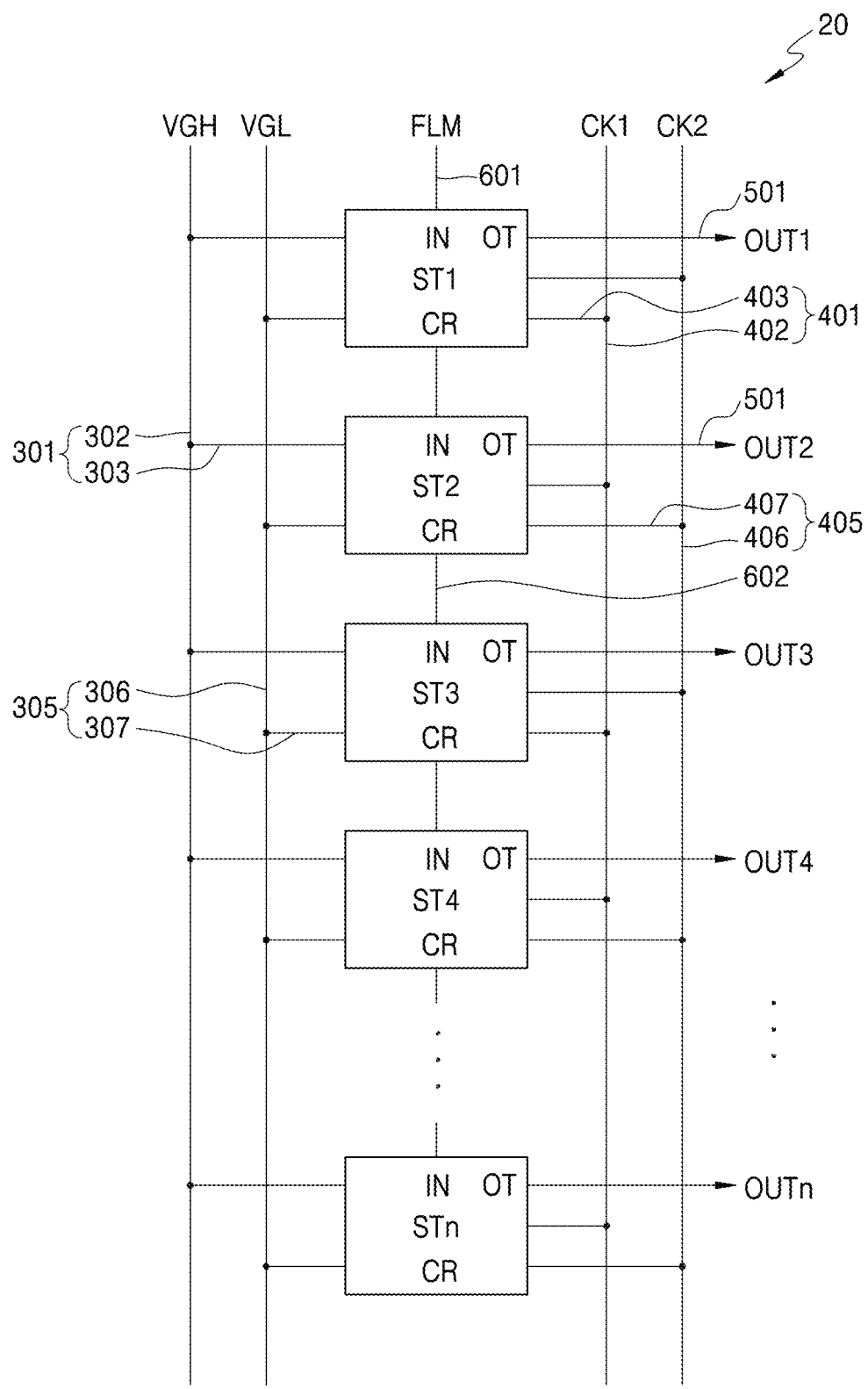
FIG. 4 is a schematic block diagram showing an embodiment of a scan driver shown in FIG. 2.

FIG. 1 is a schematic top-plan view of a display device 10 according to an embodiment of the disclosure, FIG. 2 is a schematic block diagram of a structure of the display device 10 of FIG. 1, FIG. 3 is an equivalent circuit diagram of an embodiment of a sub-pixel of the display device 10 of FIG. 1, and FIG. 4 is a schematic block diagram of an embodiment of a scan driver 20 shown in FIG. 2.

First, referring to FIGS. 1 and 2, an embodiment of the display device 10 includes a display area DA for displaying an image and a peripheral area PA located at an outer periphery of the display area DA. In such an embodiment, a substrate 100 of the display device 10 includes the display area DA and the peripheral area PA.

In an embodiment, as shown in FIG. 2, a plurality of scan lines SL extending in a first direction X, a plurality of data lines DL extending in a second direction Y that intersects with the first direction X, and a plurality of sub-sub-pixels P are in the display area DA. Herein, a third direction Z (shown in FIG. 5) may be a direction perpendicular to a plane defined by the first direction X and the second direction Y, or a thickness direction of the substrate 100. In such an embodiment, the scan driver 20 configured to provide a scan signal to the plurality of scan lines SL may be in the display area DA.

Each of the plurality of sub-pixels is connected to a corresponding data line DL from among the plurality of data lines DL and a corresponding scan line SL from among the plurality of scan lines SL, and may receive a data signal and a scan signal. Each sub-pixel P may include a light-emitting diode and emit red, green, blue, or white light. In one embodiment, for example, each sub-pixel P may include an organic light-emitting diode OLED as the light-emitting diode.

FIG. 3 shows an equivalent circuit diagram of an embodiment of a sub-pixel. Referring to FIG. 3, a sub-pixel P may include a pixel circuit PC, which is connected to a scan line SL and a data line DL, and an organic light-emitting diode OLED electrically connected to the pixel circuit PC.

The pixel circuit PC may include a first thin-film transistor Ts, a second thin-film transistor Td, and a storage capacitor Cst. The first thin-film transistor Ts, which is connected to the scan line SL and the data line DL, may deliver a data signal input via the data line DL to the second thin-film transistor Td, in response to a scan signal input via the scan line SL.

The storage capacitor Cst, which is connected to the first thin-film transistor Ts and a driving voltage supply line PL, may store a voltage corresponding to a difference between a voltage received from the first thin-film transistor Ts and a driving voltage ELVDD supplied to the driving voltage supply line PL.

The second thin-film transistor Td, which is connected to the driving voltage line PL and the storage capacitor Cst, may control a driving current flowing from the driving voltage supply line PL to the organic light-emitting diode OLED, in correspondence to a value of the voltage stored in the storage capacitor Cst. The organic light-emitting diode OLED may emit light having a luminance according to the driving current. The organic light-emitting diode OLED may emit, for example, red, green, blue, or white light.

In an embodiment, the sub-pixel P includes two thin-film transistors (e.g., the first thin-film transistor Ts and the second thin-film transistor Td) and a single storage capacitor Cst, as described with reference to FIG. 3, but the disclosure is not limited thereto. In an alternative embodiment, the pixel circuit PC of the sub-pixel P may be variously modified, for example, to include at least three thin-film transistors or at least two storage capacitors.

Referring back to FIG. 2, the scan driver 20 may receive a scan driver control signal SCS from a controller 40 and generate a scan signal in response to the scan driver control signal SCS. The scan driver 20 is in the display area DA. In one embodiment, for example, the scan driver 20 may be under a plurality of pixels P. Accordingly, the peripheral area PA may be reduced compared to a conventional display device in which the scan driver 20 is in the peripheral area PA. Decrease in the peripheral area PA will be described later in greater detail with reference to FIGS. 5 and 6.

FIG. 4 is a schematic block diagram of an embodiment of the scan driver 20. Referring to FIGS. 2 and 4, the scan driver 20 may include a plurality of stages ST1 through STn. The plurality of stages ST1 through STn respectively output scan signals OUT1 through OUTn through output terminals OT, and output lines 501 connected to the output terminals OT may be electrically connected to the scan lines SL and deliver the scan signals OUT1 through OUTn to the scan lines SL.

The stages ST1 through STn may be respectively connected to a plurality of lines arranged outside of the stages ST1 through STn. The plurality of lines may include voltage lines including a first driving voltage line 301 and a second driving voltage line 305, and clock lines including a first clock line 401 and a second clock line 405.

The first driving voltage line 301 may deliver a first driving voltage VGH, which is transmitted from a power supply unit 50, to the stages ST1 through STn. The first driving voltage line 301 may include a first main line 302 and a plurality of first connection lines 303. Each of the first connection lines 303 may connect the first main line 302 to a stage corresponding thereto from among the stages ST1 through STn.

The second driving voltage line 305 may deliver a second driving voltage VGL, which is transmitted from the power supply unit 50, to the stages ST1 through STn. The second driving voltage line 305 may include a second main line 306 and a plurality of second connection lines 307. Each of the second connection lines 307 may connect the second main line 306 to a stage corresponding thereto from among the stages ST1 through STn.

The first clock line 401 may deliver a first clock signal CK1, which is delivered from the controller 40, to the stages ST1 through STn. The first clock line 401 may include a third main line 402 and a plurality of third connection lines 403. Each of the third connection lines 403 may connect the third main line 402 to a stage corresponding thereto from among the stages ST1 through STn.

The second clock line 405 may deliver a second clock signal CK2, which is transmitted from the controller 40, to the stages ST1 through STn. The second clock line 405 may include a fourth main line 406 and a plurality of fourth connection lines 407. Each of the fourth connection lines 407 may connect the fourth main line 406 to a stage corresponding thereto from among the stages ST1 through STn.

From among the stages ST1 through STn, a first stage ST1 may receive a starting signal FLM from a starting signal line 601 through an input terminal IN. Except for the first stage ST1, other stages ST2 through STn may receive a carry signal as a starting signal from a carry line 602 connected to carry output terminals CR of previous stages ST1 through STn through the input terminal IN thereof. The carry signal may be a scan signal of a previous stage. Accordingly, the scan signal may be sequentially applied to the plurality of scan lines SL that are arranged apart from one another in the second direction Y.

FIG. 4 shows an embodiment in which only two voltage lines and two clock lines are connected to a stage. Alternatively, two or more voltage lines and/or two or more other clock lines may be connected to a stage according to a modified configuration of a circuit that constructs the stages.

Referring back to FIGS. 1 and 2, a data driver 30, the controller 40, a common voltage line 420, a driving voltage line 430, and the like may be in the peripheral area PA.

The data driver 30 may receive image data DATA and a data driver control signal DCS from the controller 40, generate a data signal in correspondence to the image data DATA and the data driver control signal DCS, and provide the generated data signal to the data lines DL.

The controller 40 may control the scan driver 20, the data driver 30, and the power supply unit 50. The controller 40 may generate a scan driver control signal SCS, the data driver control signal DCS and a power supply control signal PCS based on a control signal from outside to control the scan driver 20, the data driver 30 and the power supply unit 50.

The power supply unit 50 may provide a common voltage ELVSS and a driving voltage ELVDD to each pixel P through the common voltage line 420 and the driving voltage line 430. In one embodiment, for example, the driving voltage ELVDD may be a positive voltage, and the common voltage ELVSS may be a negative voltage or a ground voltage. In an embodiment, the power supply unit 50 may provide a first driving voltage VGH and a second driving voltage VGL to the scan driver 20. The first driving voltage VGH may be different from the second driving voltage VGL. In one embodiment, for example, the first driving voltage VGH may be a positive voltage higher than the driving voltage ELVDD, and the second driving voltage VGL may be a negative voltage lower than the common voltage ELVSS.

Figure 5:
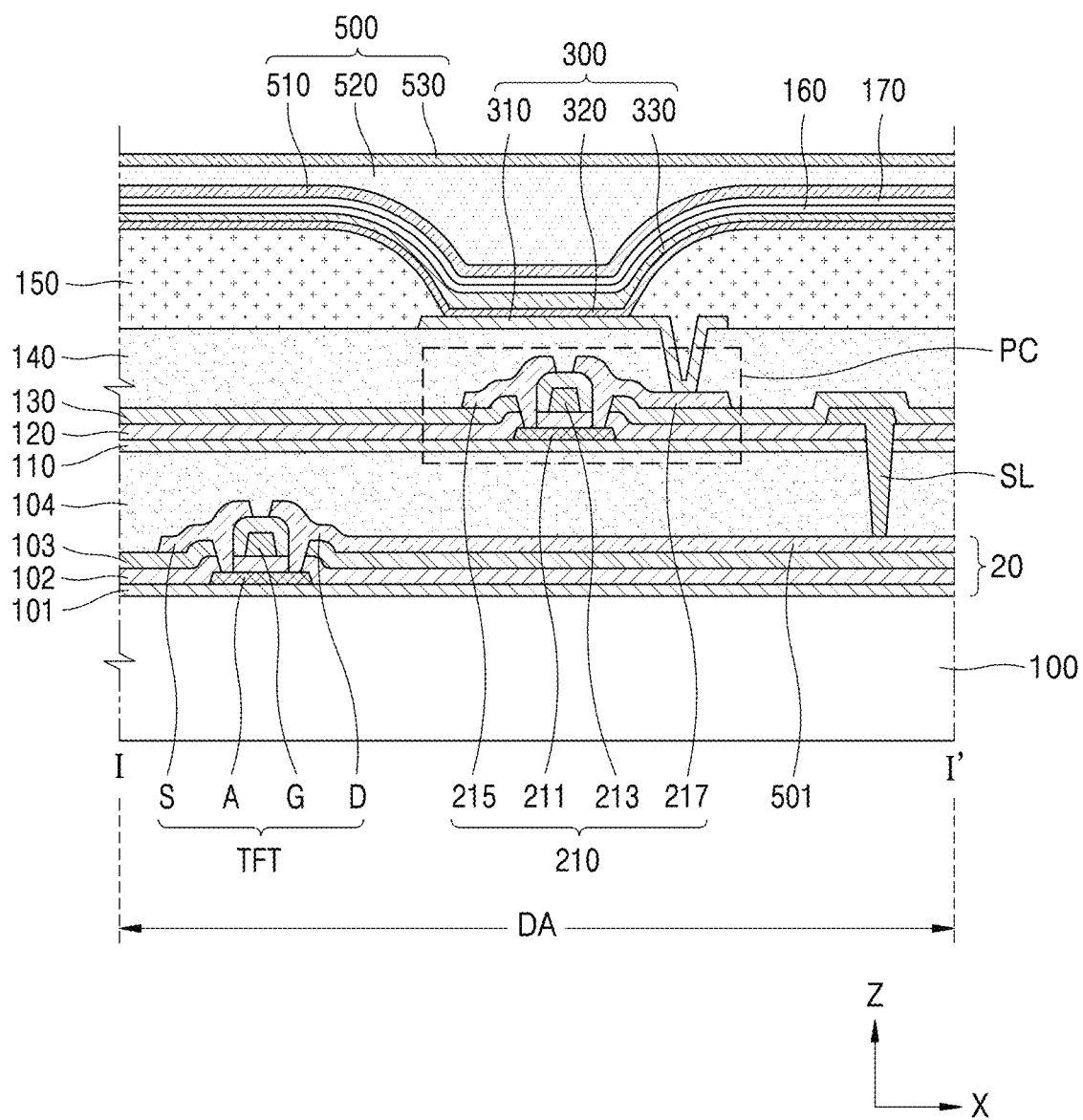
FIG. 5 is a schematic cross-sectional view of an embodiment of the display device, take along line I-I' in FIG. 1.

FIG. 5 is a schematic cross-sectional view of an embodiment of the display device, taken along line I-I' in FIG. 1.

Referring to FIG. 5, in the display area DA (see FIG. 1), a thin-film transistor 210, a light-emitting diode 300 electrically connected to the thin-film transistor 210, and the scan driver 20 between the substrate 100 and the thin-film transistor 210 may be arranged above the substrate 100.

In one embodiment, for example, the light-emitting diode 300 may include an organic light-emitting diode OLED, and the thin-film transistor 210 may correspond to the second thin-film transistor Td (see FIG. 3) of the pixel circuit PC. For convenience of illustration and description, FIG. 5 shows only one thin-film transistor 210 in the pixel circuit PC. However, as described above, the first thin-film transistor Ts (see FIG. 3) and the storage capacitor Cst (see FIG. 3) may be included in the pixel circuit PC.

The substrate 100 may include at least one of various materials such as a glass, a metal, or a polymer resin. In an embodiment, where the substrate 100 includes a metal, the substrate 100 may include iron, chromium, manganese, nickel, titanium, molybdenum, stainless steel (SUS), an Invar alloy, an Inconel alloy, a Kovar alloy, or the like. In an embodiment, the substrate 100 may include a polymer resin such as polyether sulphone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), or cellulose acetate propionate ("CAP").

A first buffer layer 101 may be on the substrate 100. The first buffer layer 101 may provide a planarized surface on the substrate 100 and prevent or block foreign materials and the like from permeating through the substrate 100. In one embodiment, for example, the first buffer layer 101 may include an inorganic material such as silicon oxide, silicon nitride, silicon oxynitride, aluminum oxide, aluminum nitride, titanium oxide, or titanium nitride or an organic material such as PI, polyester, or acryl, and the first buffer layer 101 may have a stack structure including a plurality of layers including materials from among the above-mentioned materials.

The scan driver 20 may be on the first buffer layer 101. FIG. 5 shows only one thin-film transistor TFT and one output line 501 included in one stage of the scan driver 20. However, as described above, it will be understood that the scan driver 20 may include the plurality of stages ST1 through STn (see FIG. 4), and the plurality of stages ST1 through STn (see FIG. 4) may respectively include a plurality of thin-film transistors TFT.

In an embodiment, the scan driver 20 is between the substrate 100 and the thin-film transistor 210 of the pixel circuit PC. In an embodiment, a distance between the scan driver 20 and the substrate 100 may be less than a distance between the pixel circuit PC and the substrate 100. Herein, the distance described above may be a distance in the third direction Z or the thickness direction of the substrate 100.

The scan driver 20 includes a thin-film transistor TFT, and the thin-film transistor TFT of the scan driver 20 may include an active layer A, a gate electrode G, a source electrode S, and a drain electrode D.

In an embodiment, the active layer A may include a semiconductor material such as amorphous silicon or polycrystalline silicon. In an alternative embodiment, the active layer A may include an organic semiconductor material and the like. In another alternative embodiment, the active layer A may include an oxide semiconductor material. In one embodiment, for example, the active layer A may include Group I-II, Group I-III, Group I-IV metal elements such as zinc (Zn), indium (In), gallium (Ga), stannum (Sn), cadmium (Cd), and germanium (Ge), and an oxide of a material selected from the above-mentioned materials.

A first gate insulating layer 102 is on the active layer A. The first gate insulating layer 102 prevents a short circuit between the active layer A and the gate electrode G. The first gate insulating layer 102 may have a single layer structure or a multi-layer structure including an inorganic material such as silicon oxide and/or silicon nitride. The first gate insulating layer 102 may correspond to an entire area of the substrate 100.

The gate electrode G is on the first gate insulating layer 102. The gate electrode G may include a low-resistance metal material. In one embodiment, for example, the gate electrode G may have a single layer structure or a multi-layer structure including one or more materials selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first interlayer insulating layer 103 is disposed or formed on the gate electrode G. The first interlayer insulating layer 103 may be formed to correspond to the entire area of the substrate 100. The first interlayer insulating layer 103 may have a multi-layer structure or a single layer structure including an inorganic material. In one embodiment, for example, the inorganic material may be a metal oxide or a metal nitride, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The source electrode S and the drain electrode D may be disposed or formed on the first interlayer insulating layer 103. The source electrode S and the drain electrode D may respectively be in contact with areas of the active layer A through contact holes defined through in the first gate insulating layer 102 and the first interlayer insulating layer 103. The source electrode S and the drain electrode D may have a single layer structure or a multi-layer structure including one or more materials selected from among Al, Pt, Pd, Ag, Mg, Au, Ni, Nd, Ir, Cr, Li, Ca, Mo, Ti, W, and Cu. In such an embodiment, the drain electrode D may be an output terminal OT (see FIG. 4) of the scan driver 20 through which the scan signal is output.

An output line 501 may be on the first interlayer insulating layer 103. The output line 501 may include a same material as the source electrode S and the drain electrode D. The output line 501 may be integrally formed in a single unitary body with the drain electrode D, or alternatively, the output line 501 may be electrically connected to the drain electrode D through another component.

The output line 501 delivers the scan signal, which is output from the scan driver 20, to the scan line SL. Accordingly, the number of the scan lines SL may be equal to the number of the output lines 501.

In an embodiment, the output line 501 may extend in the first direction X to cross the display area DA in correspondence to the scan line SL extending in the first direction X and may be in contact with the scan line SL at one or more points. In one embodiment, for example, as shown in FIG. 2, when one scan line SL is connected to the plurality of sub-pixels P (see FIG. 2) arranged in the first direction X, one output line 501 extending in the first direction X in correspondence to the scan line SL may be in contact with the scan line SL in each of the sub-pixels P (see FIG. 2). In such an embodiment, the number of contact points between the scan line SL and the output line 501 may be equal to the number of the pixel circuits PC connected to the scan line SL. In an alternative embodiment, the output line 501 and the scan line SL may be in contact at one point or may be in contact with each other in units of the plurality of sub-pixels P (see FIG. 2) in the first direction X. Accordingly, differences between the scan signals provided to each of the plurality of sub-pixels P (see FIG. 2) may be significantly reduced. In such an embodiment, because the scan driver 20 is in the display area DA, an area of the peripheral area PA (see FIG. 1) is reduced compared to a conventional display device in which the scan driver 20 is at an outer periphery of the display area DA, and as a result, the display area DA may be expanded.

The scan driver 20 may be covered by the first planarization layer 104. The first planarization layer 104 may planarize a step structure formed by the scan driver 20. The first planarization layer 104 may include a general purpose polymer such as polymethylmethacrylate ("PMMA") or polystyrene ("PS"), a polymer derivative having a phenol group, an acryl-based polymer, an aryl ether-based polymer, an amide-based polymer, a fluorine-based polymer, a p-xylene based polymer, a vinyl alcohol-based polymer, and a combination (e.g., a blend) thereof.

A second buffer layer 110 may be on the first planarization layer 104, and the thin-film transistor 210 may be on the second buffer layer 110.

The second buffer layer 110 may be identical to the first buffer layer 101.

The thin-film transistor 210 may include a semiconductor layer 211 that includes amorphous silicon, polycrystalline silicon, or an organic semiconductor material, a gate electrode 213, a source electrode 215, and a drain electrode 217. In an embodiment, the semiconductor layer 211 of the thin-film transistor 210 may be substantially the same as or different from the active layer A of the thin-film transistor TFT included in the scan driver 20. In one embodiment, for example, the semiconductor layer 211 and the active layer A may both include a semiconductor material, such as amorphous silicon or polycrystalline silicon, or an oxide semiconductor material. In one alternative embodiment, for example, one of the semiconductor layer 211 and the active layer A may include an oxide semiconductor material and the other of the semiconductor layer 211 and the active layer A may include a semiconductor material such as silicon.

The gate electrode 213 is arranged on the semiconductor layer 211, and the source electrode 215 and the drain electrode 217 are electrically connected to each other in response to a signal applied to the gate electrode 213. The gate electrode 213 may include, for example, one or more materials selected from among Al, Pt, Pd, Ag, Mg, Au, Ni, Nd, Ir, Cr, Li, Ca, Mo, Ti, W and Cu, and may have a single layer or multi-layer structure. In such an embodiment, to secure insulation between the semiconductor layer 211 and the gate electrode 213, a second gate insulating layer 120 may be between the semiconductor layer 211 and the gate electrode 213, and the second gate insulating layer 120 may include an inorganic material such as silicon oxide, silicon nitride, or silicon oxynitride. The second gate insulating layer 120 may be over the entire area of the substrate 100.

A second interlayer insulating layer 130 may be arranged on the gate electrode 213, and the second interlayer insulating layer 130 may have a single-layer or multi-layer structure including an inorganic material such as silicon oxide, silicon nitride, or silicon oxynitride. The second interlayer insulating layer 130 may be provided or formed on the entire area of the substrate 100.

The source electrode 215 and the drain electrode 217 are arranged on the second interlayer insulating layer 130. The source electrode 215 and the drain electrode 217 are each electrically connected to the semiconductor layer 211 via a contact hole defined through the second interlayer insulating layer 130 and the second gate insulating layer 120. Considering conductivity and the like, the source electrode 215 and the drain electrode 217 may include one or more materials selected from among AL, Pt, Pd, Ag, Mg, Au, Ni, Nd, Ir, Cr, Li, Ca, Mo, Ti, W, Cu and have a single-layer or multi-layer structure.

A second planarization layer 140 may be arranged on the thin-film transistor 210. In one embodiment, for example, when the light-emitting diode 300 is arranged at a position higher than a position of the thin-film transistor 210 as shown in FIG. 5, the second planarization layer 140 may cover the thin-film transistor 210 to planarize unevenness formed due to the thin-film transistor 210. The second planarization layer 140 may include, for example, an organic insulating material such as acryl, benzocyclobutene ("BCB"), or hexamethyldisiloxane ("HMDSO").

The light-emitting diode 300 having a pixel electrode 310, an opposite electrode 330, and an intermediate layer 320 arranged between the pixel electrode 310 and the opposite electrode 330 and including an emission layer is arranged on the second planarization layer 140. In one embodiment, for example, the light-emitting diode 300 may include an organic light-emitting diode OLED.

An opening for exposing at least one of the source electrode 215 and the drain electrode 217 of the thin-film transistor 210 is defined or form in the second planarization layer 140, and the pixel electrode 310 that is in contact with one of the source electrode 215 and the drain electrode 217 through the opening and electrically connected to the thin-film transistor 210 is arranged on the second planarization layer 140.

The pixel electrode 310 may include a (semi) transparent electrode or a reflective electrode. In an embodiment, where the pixel electrode 310 includes a (semi) transparent electrode, the pixel electrode 310 may include, for example, indium tin oxide ("ITO"), indium zinc oxide ("IZO"), ZnO, $In_2O_3$, or aluminum zinc oxide ("AZO"). In an embodiment, where the pixel electrode 310 includes a reflective electrode, the pixel electrode 310 may include a reflective film including Ag, Mg, Al, Pt, Pd, Au, Ni, Nd, Ir, Cr, and a combination thereof and a layer including ITO, IZO, ZnO, $In_2O_3$, indium gallium oxide ("IGO"), or AZO. The disclosure is not limited thereto, and the pixel electrode 310 may include one or more of various materials. A structure of the pixel electrode 310 may be variously modified, for example, into a single layer or multi-layer structure.

A pixel defining layer 150 may be arranged on the second planarization layer 140. The pixel defining layer 150 defines a pixel by an opening defined therethrough to correspond to each sub-pixel P, that is, an opening that exposes at least a center portion of the pixel electrode 310. In an embodiment, as shown in FIG. 5, the pixel defining layer 150 increases a distance between an edge of the pixel electrode 310 and the opposite electrode 330 over the pixel electrode 310, thereby preventing an arc and the like from occurring at the edge of the pixel electrode 310. The above-described pixel defining layer 150 may include an organic insulating material such as PI or HMDSO.

The intermediate layer 320 of the light-emitting diode 300 includes the emission layer. The emission layer may include a high molecular weight material or a low molecular weight material that emits light of a certain color. The intermediate layer 320 may include at least one functional layer from among a hole transport layer ("HTL"), a hole injection layer ("HIL"), an electron transport layer ("ETL"), and an electron injection layer ("EIL"). The functional layer may include an organic material. In an embodiment, some of the plurality of layers included in the intermediate layer 320, that is, the functional layer(s), may be integrally formed as a single body over a plurality of light-emitting diodes 300.

The opposite electrode 330 may be arranged to cover the display area DA. The opposite electrode 330 may be integrally formed in a single unitary body with respect to a plurality of light-emitting diodes 300 and correspond to a plurality of pixel electrodes 310. The opposite electrode 330 may include a (semi) transparent electrode or a reflective electrode. In an embodiment, where the opposite electrode 330 includes a (semi) transparent electrode, the opposite electrode 330 may include a layer including a metal that has a small work function, e.g., Li, Ca, LiF/Ca, LiF/Al, Ag, Mg, and a combination thereof, and a (semi) transparent conductive layer such as ITO, IZO, ZnO, or $In_2O_3$. In an embodiment, where the opposite electrode 330 includes a reflective electrode, the opposite electrode 330 may include a layer including Li, Ca, LiF/Ca, LiF/Al, Al, Ag, Mg, and a combination thereof. The configuration and materials of the opposite electrode 330 are not limited thereto and may be variously modified.

A capping layer 160, which improves the efficiency of light emitted from the light-emitting diode 300, may be on the opposite electrode 330. The capping layer 160 may cover the opposite electrode 330 and extend to outside of the opposite electrode 330 to be in contact with a protective conductive layer 421 under the opposite electrode 330.

In an embodiment, the capping layer 160 improves the efficiency of light emitted from the light-emitting diode 300. In one embodiment, for example, the capping layer 160 may improve optical extraction efficiency to outside and the like.

It is desired that the improvement of efficiency by the capping layer 160 is regularly performed with respect to the display area DA. Considering the above-mentioned feature, the capping layer 160 has an upper surface corresponding to a curve of an upper surface of a layer below the capping layer 160 to improve optical extraction efficiency. In such an embodiment, as shown in FIG. 5, in a portion of the capping layer 160 on the opposite electrode 330, the upper surface of the capping layer 160 may correspond to a curve of an upper surface of the opposite electrode 330. The capping layer 160 includes an organic material.

An encapsulation layer 500 is on the capping layer 160. The encapsulation layer 500 protects the light-emitting diode 300 from external moisture or oxygen. In an embodiment, the encapsulation layer 500 extends to the display area DA, in which the light-emitting diode 300 is arranged, and the peripheral area PA (see FIG. 1) outside the display area DA. The encapsulation layer 500 may have a multi-layer structure. In an embodiment, as shown in FIG. 5, the encapsulation layer 500 may include a first inorganic encapsulation layer 510, an organic encapsulation layer 520, and a second inorganic encapsulation layer 530.

The first inorganic encapsulation layer 510 may cover the capping layer 160 and include silicon oxide, silicon nitride, and/or silicon oxynitride.

In an embodiment where the first inorganic encapsulation layer 510 is formed along a structure located thereunder, as shown in FIG. 5, an upper surface of the first inorganic encapsulation layer 510 may not be even. The organic encapsulation layer 520 covers the first inorganic encapsulation layer 510 and has a sufficient thickness, and thus, an upper surface of the organic encapsulation layer 520 may be substantially even over an entire area of the display area DA. The organic encapsulation layer 520 may include PET, PEN, PC, PI, polyethylene sulfonate, polyoxymethylene, PAR, HMDSO, an acrylic resin (for example, polymethyl methacrylate, polyacrylic acid, and the like) or a combination thereof.

The second inorganic encapsulation layer 530 may cover the organic encapsulation layer 520 and include silicon oxide, silicon nitride, and/or silicon oxynitride. The second inorganic encapsulation layer 530 may extend to outside of the organic encapsulation layer 520 to be in contact with the first inorganic encapsulation layer 510, thereby preventing the organic encapsulation layer 520 from being exposed to outside.

In an embodiment, as described above, the encapsulation layer 500 includes the first inorganic encapsulation layer 510, the organic encapsulation layer 520, and the second inorganic encapsulation layer 530. Therefore, in such an embodiment having the above-described multi-layer structure, even when cracks occur in the encapsulation layer 500, the cracks may not be connected to one another between the first inorganic encapsulation layer 510 and the organic encapsulation layer 520 or between the organic encapsulation layer 520 and the second inorganic encapsulation layer 530. Accordingly, in such an embodiment, formation of a path through which external moisture or oxygen permeates into the display area DA may be effectively prevented or minimized.

Structures under the encapsulation layer 500 may be damaged in a process of forming the encapsulation layer 500. In one embodiment, for example, the first inorganic encapsulation layer 510 may be formed by using a chemical vapor deposition method. When the first inorganic encapsulation layer 510 is formed by using a chemical vapor deposition method, a layer right under the first inorganic encapsulation layer 510 may be damaged. Accordingly, when the first inorganic encapsulation layer 510 is formed directly on the capping layer 160, the capping layer 160 that improves the efficiency of the light emitted from the light-emitting diode 300 is damaged, and therefore, the light efficiency of the display device 10 may degrade. Therefore, a protective layer 170 may be between the capping layer 160 and the encapsulation layer 500, to prevent the capping layer 160 from being damaged in a process of forming the encapsulation layer 500. The protective layer 170 may include lithium fluoride (LiF).

Figure 6:
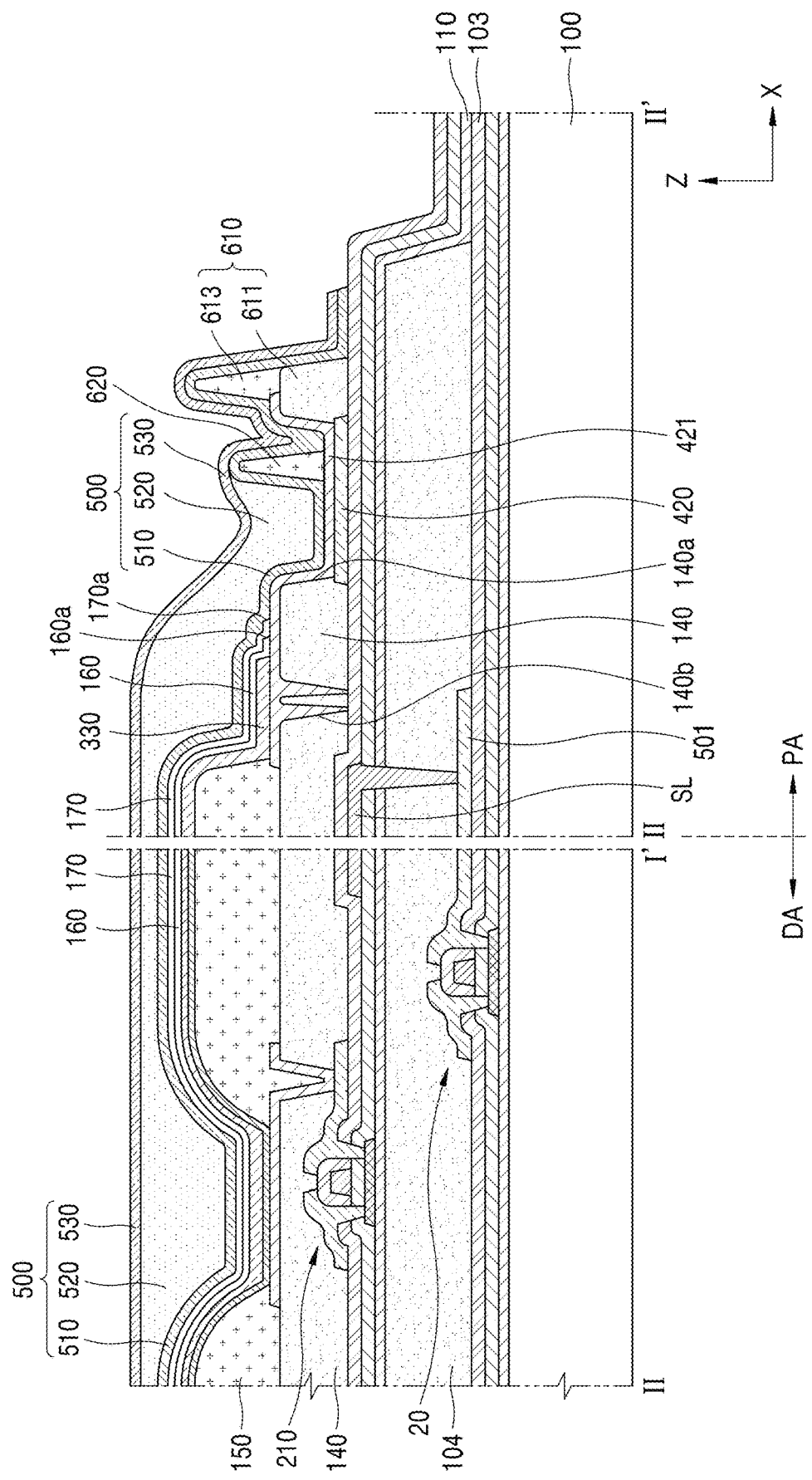
FIG. 6 is a schematic cross-sectional view of an embodiment of the display device, taken along lines I-I' and II-II' in FIG. 1.

FIG. 6 is a schematic cross-sectional view of an embodiment of the display device taken along lines I-I' and II-II' shown in FIG. 1. The same or like elements shown in FIG. 6 have been labeled with the same reference characters as used above to describe the embodiments shown in FIG. 5, and any repetitive detailed description thereof will hereinafter be omitted or simplified.

Referring to FIG. 6, in an embodiment, the opposite electrode 330 extends to the outside of the display area DA, and the capping layer 160 on the opposite electrode 330 also covers the display area DA and extends to the peripheral area PA outside the display area DA. In such an embodiment, the protective layer 170 for protecting the capping layer 160 extends to outside of the capping layer 160 to prevent the capping layer 160 and the encapsulation layer 500 from being in direct contact with each other. In such an embodiment, the protective layer 170 covers an end 160a of the capping layer 160, and an end 170a of the protective layer 170 is on the second planarization layer 140. In an embodiment, as shown in FIG. 6, the end 170a of the protective layer 170 is in direct contact with the protective conductive layer 421 on the second planarization layer 140.

Accordingly, the first inorganic encapsulation layer 510 that is a lowermost layer of the encapsulation layer 500 is not in contact with the capping layer 160, which includes an organic material, but is in contact with the protective layer 170 that includes an inorganic material such as LiF. Therefore, a bonding force between the encapsulation layer 500 and a layer thereunder may be maintained high, such that separation of the encapsulation layer 500 from the layer thereunder may be effectively prevented or minimized in a process of manufacturing the display device 10 or a process of using after the process.

In an embodiment, it is desired that a preset electrical signal is applied to the opposite electrode 330 to display an image by the display device 10 (see FIG. 1). In such an embodiment, the common voltage line 420 may be in the peripheral area PA.

The common voltage line 420 may include or be formed of a same material and at a same time as various conductive layers in the display area DA. In one embodiment, for example, the common voltage line 420 may be simultaneously formed when the source electrode 215 and the drain electrode 217 of the thin-film transistor 210 in the display area DA are formed. The disclosure is not limited thereto and may be variously modified. In one embodiment, for example, the common voltage line 420 may be simultaneously formed when the gate electrode 213 of the thin-film transistor 210 is formed.

The opposite electrode 330 may be in direct contact with the common voltage line 420 or may be electrically connected to the common voltage line 420 through the protective conductive layer 421 as shown in FIG. 6. The protective conductive layer 421 is on the second planarization layer 140 and may extend over the common voltage line 420 to be electrically connected to the common voltage line 420.

Accordingly, the opposite electrode 330 may be in contact with the protective conductive layer 421 in the peripheral area PA, and the protective conductive layer 421 may also be in contact with the common voltage line 420 in the peripheral area PA.

In an embodiment, as shown in FIG. 6, the protective conductive layer 421 may cover a portion of the common voltage line 420 that is exposed by not being covered by the second planarization layer 140, such that damage to the common voltage line 420 exposed to outside of the second planarization layer 140 may be effectively prevented in a process of forming a first limitation dam 610 or a second limitation dam 620 and the like.

In an embodiment, as shown in FIG. 6, an opening 140b is defined through the second planarization layer 140 in the display area DA to prevent impurities such as external oxygen or moisture from permeating into the display area DA through the second planarization layer 140. The opening 140b may surround the display area DA. In an embodiment, when the protective conductive layer 421 is formed, the protective conductive layer 421 may fill the opening 140b. In such an embodiment, as a metal material fills the opening 140b, impurities that permeated into the second planarization layer 140 of the peripheral area PA may be effectively prevented from permeating into the display area DA through the second planarization layer 140.

In an embodiment, when the encapsulation layer 500 is formed, and more particularly, when the organic encapsulation layer 520 is formed, it is desired to limit a material for forming the organic encapsulation layer 520 to be in a preset area. Accordingly, in such an embodiment, the first limitation dam 610 may be in the peripheral area PA as shown in FIG. 6. The first limitation dam 610 is in the peripheral area PA to be apart from the second planarization layer 140.

In an embodiment, the first limitation dam 610 may have a multi-layer structure. In such an embodiment, the first limitation dam 610 may include a first layer 611 and a second layer 613 in a direction away from a portion near the substrate 100. The first layer 611 may include or be formed of a same material and at the same time as the second planarization layer 140, and the second layer 613 may include or be formed of a same material and at the same time as the pixel defining layer 150.

In an embodiment, as shown in FIG. 6, in addition to the first limitation dam 610, the second limitation dam 620 may be between the first limitation dam 610 and an end 140a of the second planarization layer 140. The second limitation dam 620 may be on the protective conductive layer 421 on the common voltage line 420. The second limitation dam 620 is also apart from the second planarization layer 140 and is in the peripheral area PA. The second limitation dam 620 may also have a multi-layer structure as the first limitation dam 610, but the second limitation dam 620 may have a smaller number of layers than the first limitation dam 610 such that a height of the second limitation dam 620 from the substrate 100 is lower than a height of the first limitation dam 610 from the substrate 100. FIG. 6 shows an embodiment where the second limitation dam 620 and the second layer 613 of the first limitation dam 610 are simultaneously formed and include a same material as each other.

Accordingly, a position of the organic encapsulation layer 520 is limited by the second limitation dam 620 such that a material for forming the organic encapsulation layer 520 is prevented from overflowing to outside of the second limitation dam 620 in a process of forming the organic encapsulation layer 520. Even though the material for forming the organic encapsulation layer 520 partially overflows to outside of the second limitation dam 620, the position of organic encapsulation layer 520 is limited by the first limitation dam 610 and thus the material for forming the organic encapsulation layer 520 may not move further toward an edge of the substrate 100. In an embodiment, the first inorganic encapsulation layer 510 and the second inorganic encapsulation layer 530, which are formed in chemical vapor deposition method, may cover the second limitation dam 620 and the first limitation dam 610 to be formed outside the first limitation dam 610 and may be in contact with each other, as shown in FIG. 6.

In an embodiment, as in FIG. 5, the scan driver 20 is between the substrate 100 and the thin-film transistor 210 in the display area DA. However, FIG. 6 shows an embodiment in which the output line 501 and the scan line SL extend to the peripheral area PA and are in contact with each other in the peripheral area PA. In such an embodiment, the output line 501 may not be formed to be long to cross the display area DA, and the output line 501 and the scan line SL may be in contact with each other at one point, therefore, the process of manufacturing the display device 10 (see FIG. 1) may be simplified.

In an embodiment, a contact point between the output line 501 and the scan line SL may be in an area defined by the opening 140*b* formed in the peripheral area PA to surround the display area DA, such that the contact point may be stably protected from permeation of external moisture and the like, and an area of the peripheral area PA may be reduced compared to a conventional display device.

In an embodiment, the first planarization layer 104 covering the scan driver 20 may have a smaller area than the first interlayer insulating layer 103 and the second buffer layer 110 that are respectively under and above the first planarization layer 104, and the first interlayer insulating layer 103 and the second buffer layer 110 may be directly in contact with each other at an outer periphery of the first planarization layer 104. Therefore, the first planarization layer 104 is surrounded by inorganic layers (e.g., the first interlayer insulating layer 103 and the second buffer layer 110), and thus, permeation of external moisture into the display area DA may be prevented.

According to embodiments of the disclosure, as the scan driver that applies the scan signal to the plurality of pixels is under the plurality of pixels, a peripheral area of the display device may be minimized.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
a substrate;
a plurality of light-emitting diodes above the substrate;
a plurality of pixel circuits above the substrate and electrically connected to the plurality of light-emitting diodes;
a scan line extending in a first direction above the substrate, wherein the scan line delivers a scan signal to the plurality of pixel circuits; and
a scan driver between the substrate and the plurality of pixel circuits, wherein the scan driver provides the scan signal to the scan line,
wherein a distance between the scan driver and the substrate is less than a distance between the plurality of pixel circuits and the substrate.

2. The display device of claim 1, wherein
the plurality of light-emitting diodes, the plurality of pixel circuits, and the scan driver are in a display area of the display device.

3. The display device of claim 2, further comprising:
an output line electrically connected to an output terminal of the scan driver and the scan line, and
the output line is in a same layer as the output terminal.

4. The display device of claim 3, wherein
the output line extends in the first direction and crosses the display area, and
the output line and the scan line are in contact with each other in a plurality of positions.

5. The display device of claim 4, wherein
the number of contact points between the output line and the scan line is equal to the number of the plurality of pixel circuits connected to the scan line.

6. The display device of claim 3, further comprising:
a first planarization layer covering the scan driver and the output line; and
a second planarization layer between the pixel circuits and the plurality of light-emitting diodes,
wherein
the pixel circuits and the scan line are on the first planarization layer, and
the scan line is in contact with the output line via a contact hole defined in the first planarization layer.

7. The display device of claim 6, wherein
the output line and the scan line extend to a peripheral area at an outer circumstance of the display area, and
a contact point between the output line and the scan line is in the peripheral area.

8. The display device of claim 7, wherein
an opening surrounding the display area is defined in the second planarization layer, and
a metal material is in the opening.

9. The display device of claim 8, wherein
the contact point between the output line and the scan line is in an area defined by the opening.

10. The display device of claim 6, wherein
inorganic layers are respectively at an upper surface and a lower surface of the first planarization layer, and
the inorganic layers are in contact with each other at an outer periphery of the first planarization layer.

11. A display device comprising:
a substrate including a display area and a peripheral area at an outer circumference of the display area;
a scan driver on the substrate in the display area, wherein the scan driver generates a scan signal;
an output line on the substrate in the display area and electrically connected to the scan driver;
a first planarization layer covering the scan driver and the output line;
a thin-film transistor on the first planarization layer in the display area;
a scan line on the first planarization layer in the display area and connected to the output line to deliver the scan signal to the thin-film transistor;
a second planarization layer covering the thin-film transistor and the scan line; and a light-emitting diode on the second planarization layer in the display area and electrically connected to the thin-film transistor.

12. The display device of claim 11, wherein
the scan line and the output line are in contact with each other through a contact hole defined in the first planarization layer.

13. The display device of claim 12, wherein
a contact point between the output line and the scan line is in the display area.

14. The display device of claim 13, wherein
the output line and the scan line are in contact with each other in a plurality of positions.

15. The display device of claim 12, wherein
the output line and the scan line extend to the peripheral area, and
the contact point between the output line and the scan line is in the peripheral area.

16. The display device of claim 15, wherein
an opening surrounding the display area is defined in the second planarization layer, and
the opening is filled with a metal material.

17. The display device of claim 16, wherein
the contact point is in an area defined by the opening.

18. The display device of claim 17, wherein
the light-emitting diode comprises a pixel electrode electrically connected to the thin-film transistor, an opposite electrode above the pixel electrode, and an intermediate layer between the pixel electrode and the opposite electrode,
a common voltage line, which applies an electrical signal to the opposite electrode, is arranged in the peripheral area,
the opposite electrode and the common voltage line are connected to each other by a protective conductive layer, and
the protective conductive layer fills the opening.

19. The display device of claim 11, wherein
inorganic layers are respectively at an upper surface and a lower surface of the first planarization layer, and
the inorganic layers are in contact with each other at an outer periphery of the first planarization layer.

20. The display device of claim 11, wherein
the output line is integrally formed as a single unitary body with an output terminal of the scan driver, and
the output terminal is a drain electrode of a thin-film transistor of the scan driver.

* * * * *